(12) United States Patent
Okamura et al.

(10) Patent No.: US 12,424,494 B2
(45) Date of Patent: Sep. 23, 2025

(54) PROCESSING METHOD OF WAFER (71) Applicant: DISCO CORPORATION, Tokyo (JP)

(72) Inventors: Takashi Okamura, Tokyo (JP);
Shigenori Harada, Tokyo (JP);
Tomoharu Takita, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 278 days.

(21) Appl. No.: 17/330,590

(22) Filed: May 26, 2021

(65) Prior Publication Data
US 2021/0391217 A1  Dec. 16, 2021

(30) Foreign Application Priority Data
Jun. 10, 2020 (JP) ................................. 2020-100756

(51) Int. Cl.
*H01L 21/78* (2006.01)
*H01L 21/683* (2006.01)
*H01L 23/544* (2006.01)

(52) U.S. Cl.
CPC .......... *H01L 21/78* (2013.01); *H01L 21/6836* (2013.01); *H01L 23/544* (2013.01);
(Continued)

(58) Field of Classification Search
CPC ......... H01L 21/78–786; H01L 21/3043; H01L 24/97; H01L 21/304; H01L 21/3046;
(Continued)

(56) References Cited

U.S. PATENT DOCUMENTS

| 2008/0242052 A1* | 10/2008 | Feng | H01L 21/3043 |
| | | | 438/459 |
| 2010/0009519 A1* | 1/2010 | Seddon | H01L 21/6836 |
| | | | 438/464 |

(Continued)

FOREIGN PATENT DOCUMENTS

| DE | 102016111629 A1 | 12/2017 |
| JP | 2008187153 A | 8/2008 |

(Continued)

OTHER PUBLICATIONS

Office Action issued in counterpart German patent application No. 10 2021 205 759.4, dated Mar. 27, 2024.
(Continued)

*Primary Examiner* — Julio J Maldonado
*Assistant Examiner* — Stanetta D Isaac
(74) *Attorney, Agent, or Firm* — Greer Burns & Crain Ltd.

(57) ABSTRACT

There is provided a processing method of a wafer for processing the wafer that includes, on a front surface side, a device region in which a device is formed in each of plural regions marked out by plural planned dividing lines and includes a recess part on the back surface side and includes an annular reinforcing part at a peripheral part. The processing method of a wafer includes a holding step of holding the bottom surface of the recess part, a cutting step of cutting the wafer along the planned dividing lines by a cutting blade to divide the device region into plural device chips and form grooves on the front surface side of the reinforcing part, and a dividing step of dividing the reinforcing part along the planned dividing lines with the grooves being the points of origin by giving an external force to the reinforcing part.

20 Claims, 9 Drawing Sheets

(52) U.S. Cl.
CPC .............. *H01L 2221/68327* (2013.01); *H01L 2223/5446* (2013.01)

(58) Field of Classification Search
CPC ......... H01L 21/02013; H01L 21/02021; H01L 21/463; H01L 21/6836; H01L 23/32; H01L 2223/54453; H01L 2223/5446; H01L 21/6835; H01L 21/6838; H01L 21/67092; H01L 21/67132; H01L 21/68785; B23K 26/00–70; B28D 5/022
See application file for complete search history.

(56) References Cited

U.S. PATENT DOCUMENTS

| | | | |
|---|---|---|---|
| 2019/0080965 A1* | 3/2019 | Seddon | H01L 21/0332 |
| 2019/0221480 A1* | 7/2019 | Priewasser | H01L 21/78 |
| 2020/0335396 A1* | 10/2020 | Yamamoto | H01L 21/681 |

FOREIGN PATENT DOCUMENTS

| | | |
|---|---|---|
| JP | 2011061137 A | 3/2011 |
| JP | 2011210858 A | 10/2011 |
| JP | 2014093493 A | 5/2014 |
| JP | 2017174865 A | 9/2017 |

OTHER PUBLICATIONS

Office Action issued in counterpart Japanese patent application No. 2020-100756, dated Jan. 23, 2024.

\* cited by examiner

PROCESSING METHOD OF WAFER

BACKGROUND OF THE INVENTION

Field of the Invention

The present invention relates to a processing method of a wafer.

Description of the Related Art

In a manufacturing process of device chips, a wafer is used that includes, on a front surface side, a device region in which a device is formed in each of plural regions marked out by planned dividing lines (streets) arranged in a lattice manner. Plural device chips each including the device are obtained by dividing this wafer along the planned dividing lines. The device chips are mounted on various pieces of electronic equipment, such as portable phones and personal computers.

In recent years, reducing the thickness of the device chips has been required in association with size reduction of electronic equipment. Thus, processing of thinning a wafer is executed before dividing of the wafer in some cases. For the thinning of the wafer, a grinding apparatus including a chuck table that holds the wafer and a grinding unit on which a grinding wheel having plural grinding abrasive stones is mounted is used. The wafer is ground and thinned by bringing the grinding abrasive stones into contact with a back surface side of the wafer held by the chuck table. However, when the wafer is ground and thinned, rigidity of the wafer lowers. Therefore, the wafer becomes more likely to break in a subsequent conveyance step, for example. That is, handling of the wafer becomes difficult. Thus, a method in which only the region that overlaps with the device region in the back surface side of a wafer is ground and thinned has been proposed. When this method is used, a recess part is formed at the central part of the back surface side of the wafer, whereas the peripheral part of the wafer is not thinned but kept at the thick state and remains as an annular reinforcing part. Due to this, the lowering of the rigidity of the wafer after the grinding is suppressed.

The thinned wafer is divided into plural device chips finally by using a cutting apparatus that cuts a workpiece by an annular cutting blade, or the like. At this time, the wafer is cut along planned dividing lines after the annular reinforcing part that remains at the peripheral part is removed. For example, in Japanese Patent Laid-open No. 2011-61137, a method has been disclosed in which the peripheral part of a wafer is annularly cut by a cutting blade to separate the device region and a reinforcing part (annular projection part) and thereafter the reinforcing part is raised and removed by a claw assembly including plural claws.

SUMMARY OF THE INVENTION

As described above, an annular reinforcing part that remains at a peripheral part of a wafer is separated and removed from the wafer in a processing process of a wafer. However, immediately after the reinforcing part is separated from the wafer, the reinforcing part is disposed close to a device region in such a manner as to surround a central part (device region) of the wafer in a state in which rigidity has lowered through thinning. Thus, when the reinforcing part is removed, possibly the reinforcing part gets contact with the device region accidentally and the device region is damaged.

Therefore, for properly removing the reinforcing part, work of carefully holding the reinforcing part and raising the reinforcing part in such a manner as to avoid the occurrence of a swing or position deviation of the reinforcing part is required to prevent the reinforcing part from interfering with the device region. As a result, a structure of a mechanism (claw assembly or the like) used for the removal of the reinforcing part becomes complicated and the cost increases. Furthermore, the work time necessary for the removal of the reinforcing part becomes longer and operation efficiency of the processing apparatus lowers.

The present invention is made in view of such a problem and intends to provide a processing method of a wafer that can easily remove a reinforcing part that remains at the peripheral part of the wafer.

In accordance with an aspect of the present invention, there is provided a processing method of a wafer for processing the wafer that includes, on a front surface side, a device region in which a device is formed in each of a plurality of regions marked out by a plurality of planned dividing lines arranged in a lattice manner to intersect each other and includes a recess part formed in a region corresponding to the device region on a back surface side and includes an annular reinforcing part that surrounds the device region and the recess part at a peripheral part. The processing method of a wafer includes a tape sticking step of sticking an adhesive tape to the back surface side of the wafer along the recess part and the reinforcing part and a holding step of holding a bottom surface of the recess part by a first chuck table with the intervention of the adhesive tape. The processing method of a wafer also includes a cutting step of cutting the wafer along the planned dividing lines by a cutting blade to divide the device region into a plurality of device chips and form grooves on the front surface side of the reinforcing part and a dividing step of dividing the reinforcing part along the planned dividing lines with the grooves being points of origin by giving an external force to the reinforcing part.

Incidentally, preferably, in the dividing step, by sucking the adhesive tape by a second chuck table having recesses and projections at a position corresponding to the reinforcing part of the wafer in a state in which the wafer is supported by the second chuck table, the adhesive tape is disposed along the recesses and projections to divide the reinforcing part. Furthermore, preferably, the processing method of a wafer further includes a separation step of separating the device region and the reinforcing part by annularly cutting a peripheral part of the device region by the cutting blade after execution of the holding step and before execution of the dividing step.

Moreover, preferably, the processing method of a wafer further includes a reinforcing part removal step of removing the reinforcing part by jetting fluid to the reinforcing part after execution of the dividing step. Furthermore, preferably, the fluid is jetted from the center side of the wafer toward the peripheral side of the wafer. The fluid may be mixed fluid containing a gas and a liquid. Moreover, the fluid may be a liquid.

Furthermore, preferably, the processing method of a wafer further includes a scribed line forming step of forming a plurality of scribed lines in the reinforcing part along the radial direction of the reinforcing part after execution of the cutting step and before execution of the dividing step.

In the processing method of a wafer according to the aspect of the present invention, in the cutting step, the device region is divided into the plural device chips. In addition, the grooves are formed on the front surface side of the reinforcing part. Then, in the dividing step, an external force is given to the reinforcing part and the reinforcing part is divided with the grooves being the points of origin. As a result, it becomes possible to easily remove the reinforcing part from the wafer by a simple method such as jetting the fluid to the divided reinforcing part, for example.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
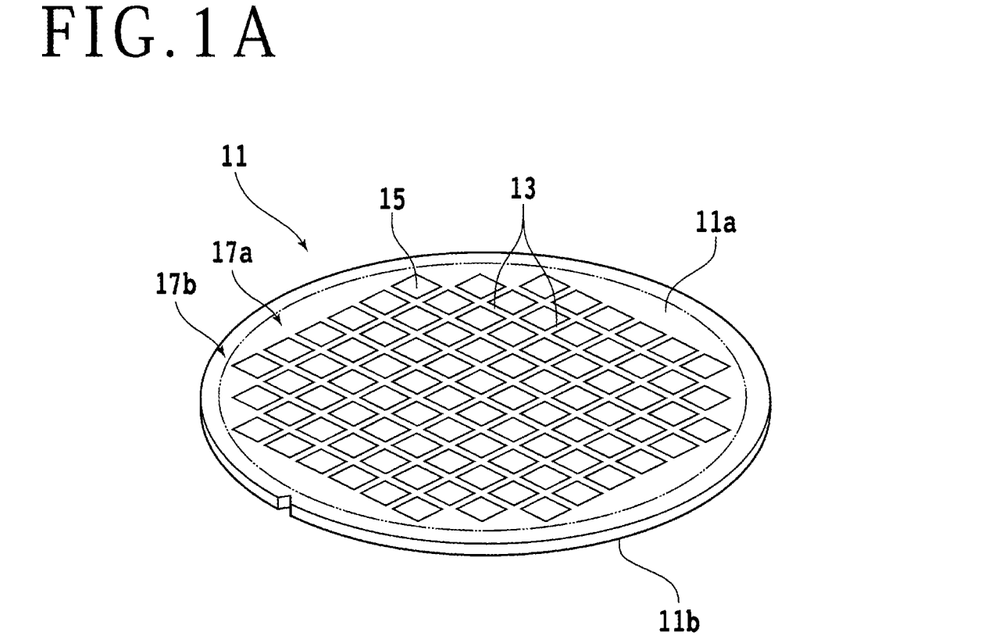
FIG. 1A is a perspective view illustrating a front surface side of a wafer.
Figure 1B:
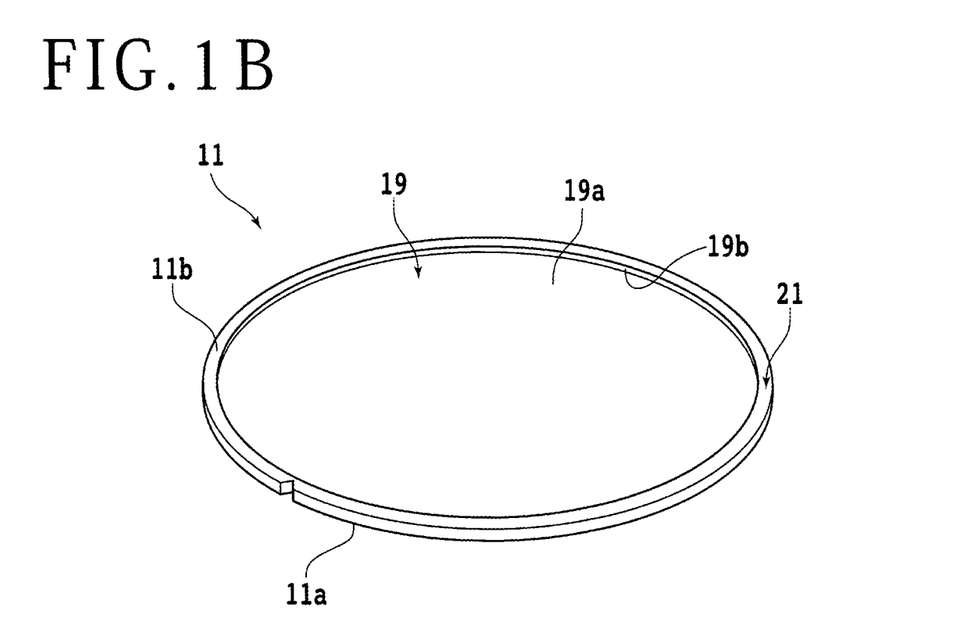
FIG. 1B is a perspective view illustrating a back surface side of the wafer.

An embodiment according to one aspect of the present invention will be described below with reference to the accompanying drawings. First, a configuration example of a wafer that can be processed by a processing method of a wafer according to the present embodiment will be described. FIG. 1A is a perspective view illustrating the front surface side of the wafer 11. FIG. 1B is a perspective view illustrating the back surface side of the wafer 11.

The wafer 11 is a substrate that is composed of a semiconductor such as silicon and has a circular disc shape, for example, and includes a front surface 11a and a back surface 11b that are substantially parallel to each other. The wafer 11 is segmented into plural rectangular regions by plural planned dividing lines (streets) 13 arranged in a lattice manner to intersect each other. Furthermore, a device 15 such as an integrated circuit (IC), large scale integration (LSI), a emitting diode (LED), or micro-electro-mechanical systems (MEMS) is formed on the side of the front surface 11a in each of the regions marked out by the planned dividing lines 13.

The wafer 11 includes, on the side of the front surface 11a, a substantially circular device region 17a in which the plural devices 15 are formed and an annular peripheral surplus region 17b that surrounds the device region 17a. The peripheral surplus region 17b is equivalent to an annular region that includes the peripheral edge of the front surface 11a and has a predetermined width (for example, approximately 2 mm). In FIG. 1A, the boundary between the device region 17a and the peripheral surplus region 17b is illustrated by a two-dot chain line.

Incidentally, there is no limit on the material, shape, structure, size, and so forth of the wafer 11. For example, the wafer 11 may be a substrate composed of a semiconductor other than silicon (GaAs, InP, GaN, SiC, or the like), glass, ceramic, resin, metal, or the like. Furthermore, there is no limit also on the kind, quantity, shape, structure, size, arrangement, and so forth of the devices 15.

Plural device chips each including the device 15 are manufactured by dividing the wafer 11 in a lattice manner along the planned dividing lines 13. Furthermore, it becomes possible to obtain device chips with a reduced thickness by executing thinning treatment for the wafer 11 before dividing. For the thinning of the wafer 11, for example, the grinding apparatus is used. The grinding apparatus includes a chuck table (holding table) that holds the wafer 11 and a grinding unit that grins the wafer 11, and an annular grinding wheel having plural grinding abrasive stones are mounted on the grinding unit. By bringing the grinding abrasive stones into contact with the side of the back surface 11b of the wafer 11 while rotating each of the chuck table and the grinding wheel, the side of the back surface 11b of the wafer 11 is ground and the wafer 11 is thinned. However, when the whole of the side of the back surface 11b of the wafer 11 is ground, the whole of the wafer 11 is thinned and the rigidity of the wafer 11 lowers. Therefore, the wafer 11 becomes more likely to break in a subsequent conveyance step, for example. That is, handling of the wafer 11 becomes difficult.

Thus, thinning treatment (grinding processing) is executed for only the central part on the side of the back surface 11b of the wafer 11 in some cases. For example, as illustrated in FIG. 1B, only the central part is thinned in the wafer 11 and a circular recess part (groove) 19 is formed in the back surface 11b of the wafer 11. The recess part 19 is made at a position corresponding to the device region 17a. For example, the size (diameter) of the recess part 19 is set to substantially the same as the size (diameter) of the device region 17a and the recess part 19 is formed at a position that overlaps with the device region 17a. The recess part 19 includes a bottom surface 19a substantially parallel to the front surface 11a and the back surface 11b of the wafer 11 and an annular side surface (inner wall) 19b that is substantially perpendicular to the bottom surface 19a and is connected to the bottom surface 19a and the back surface 11b of the wafer 11. Furthermore, a reinforcing part (projection part) 21 equivalent to the region for which the thinning treatment (grinding processing) has not been executed remains at the peripheral part of the wafer 11. The reinforcing part 21 includes the peripheral surplus region 17b and surrounds the device region 17a and the recess part 19. When only the central part of the wafer 11 is thinned, the peripheral part (reinforcing part 21) of the wafer 11 is kept at the thick state. Due to this, the lowering of the rigidity of the wafer 11 is suppressed and breakage and so forth of the wafer 11 become less likely to occur. That is, the reinforcing part 21 functions as a reinforcing region that reinforces the wafer 11.

Figure 2A:
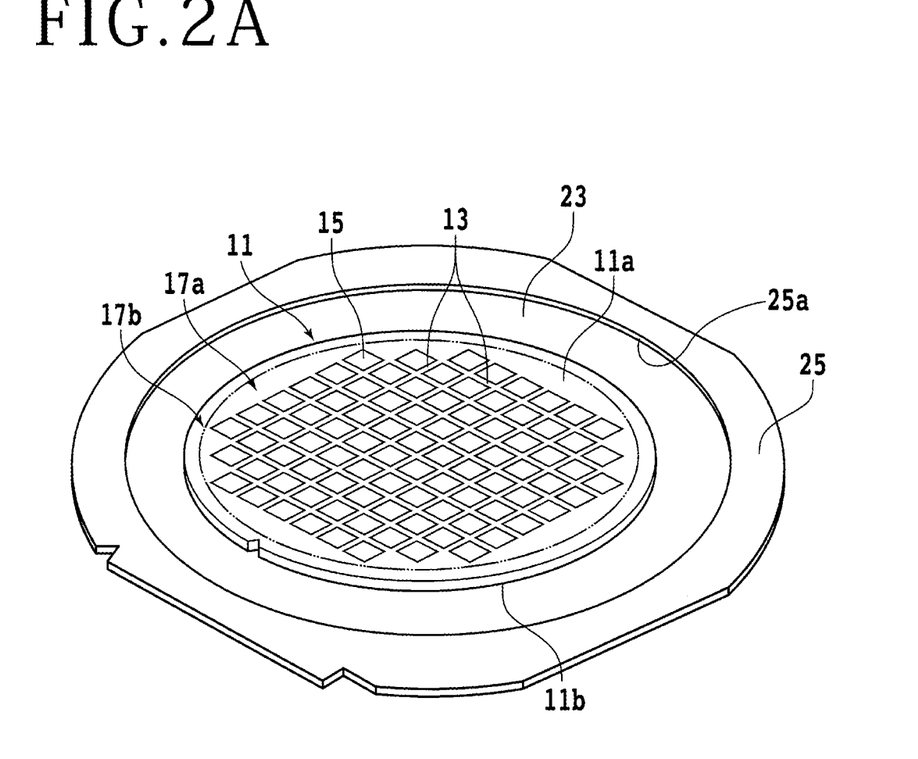
FIG. 2A is a perspective view illustrating the wafer to which an adhesive tape is stuck.
Figure 2B:
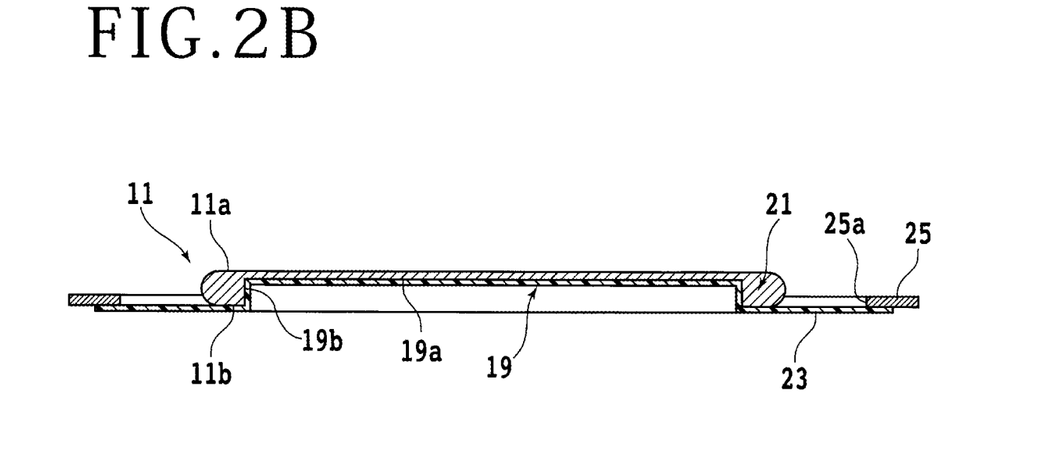
FIG. 2B is a sectional view illustrating the wafer to which the adhesive tape is stuck.

Next, a specific example of the processing method of a wafer for dividing the wafer 11 into plural device chips will be described. In the present embodiment, first, an adhesive tape is stuck to the side of the back surface 11b of the wafer 11 (tape sticking step). FIG. 2A is a perspective view illustrating the wafer 11 to which an adhesive tape 23 is stuck. FIG. 2B is a sectional view illustrating the wafer 11 to which the adhesive tape 23 is stuck.

The adhesive tape 23 with a size that allows covering of the whole of the side of the back surface 11b of the wafer 11 is stuck to the side of the back surface 11b of the wafer 11. For example, the adhesive tape 23 having a circular shape with a larger diameter than the wafer 11 is stuck to cover the side of the back surface 11b of the wafer 11. As the adhesive tape 23, a flexible film including a circular base and an adhesive layer (glue layer) made on the base can be used. For example, the base is composed of a resin such as polyolefin, polyvinyl chloride, or polyethylene terephthalate, and the adhesive layer is composed of an epoxy-based, acrylic-based, or rubber-based adhesive or the like. Furthermore, it is also possible to use an ultraviolet-curable resin that is cured by irradiation with ultraviolet rays for the adhesive layer.

The adhesive tape 23 is stuck along the contour of the side of the back surface 11b of the wafer 11. That is, as illustrated in FIG. 2B, the adhesive tape 23 is stuck along (in line with) the bottom surface 19a and the side surface 19b of the recess part 19 and the back surface (lower surface) of the reinforcing part 21. Incidentally, in FIG. 2B, an example in which the adhesive tape 23 is stuck to be in close contact with the bottom surface 19a and the side surface 19b is illustrated. However, a slight gap may exist between the adhesive tape 23 and the peripheral part of the bottom surface 19a and between the adhesive tape 23 and the side surface 19b.

An annular frame 25 made of a metal such as stainless steel (SUS) is stuck to the peripheral part of the adhesive tape 23. A circular opening 25a in which the wafer 11 can be housed is made at the central part of the frame 25. The wafer 11 is supported by the frame 25 through the adhesive tape 23 in the state of being disposed inside the opening 25a. Due to this, a frame unit (work set) in which the wafer 11, the adhesive tape 23, and the frame 25 are integrated is configured.

Figure 3:
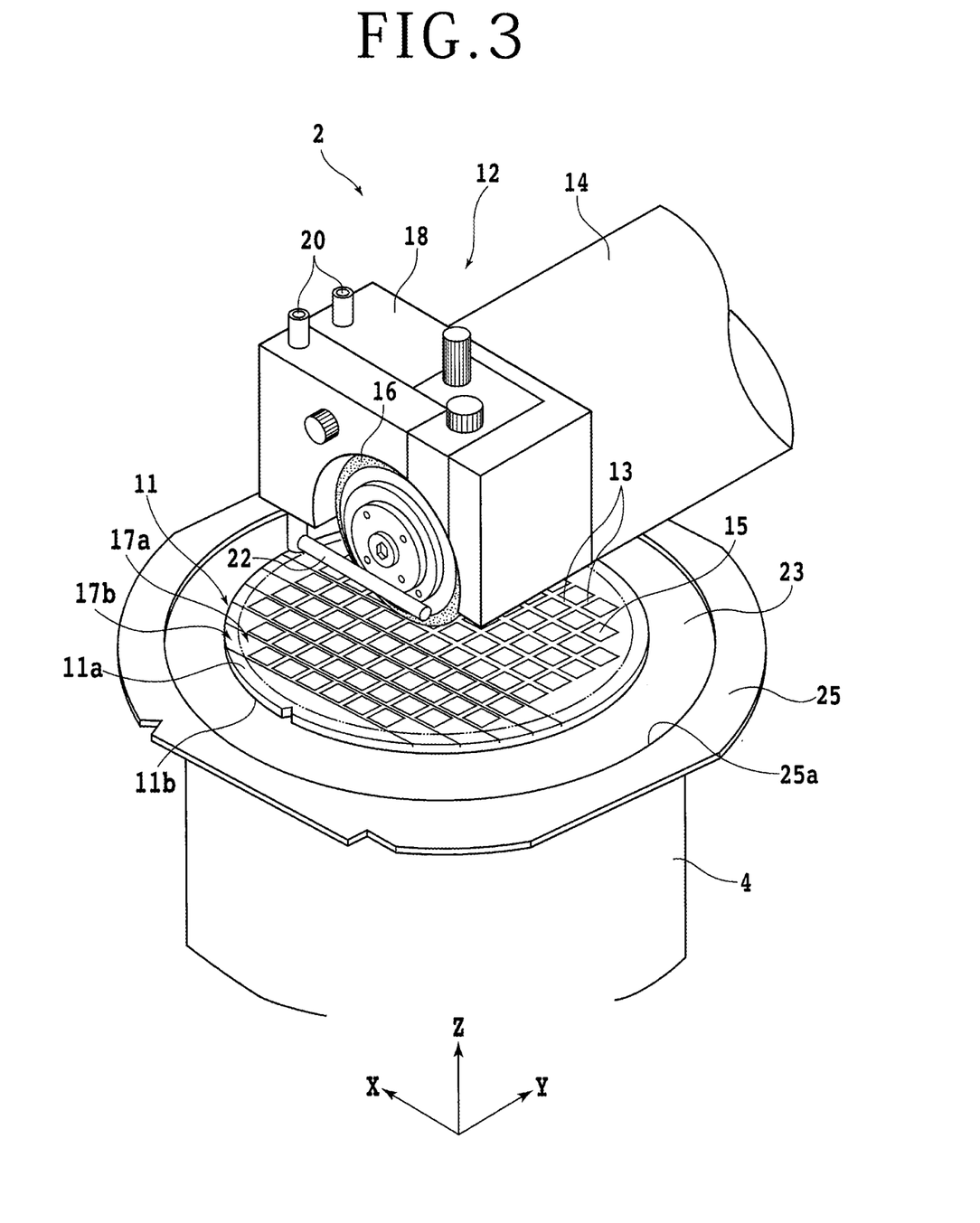
FIG. 3 is a perspective view illustrating a cutting apparatus.

The wafer 11 to which the adhesive tape 23 is stuck is cut by the cutting apparatus. FIG. 3 is a perspective view illustrating the cutting apparatus 2. The cutting apparatus 2 includes a chuck table (holding table) 4 that holds the wafer 11 and a cutting unit 12 that cuts the wafer 11 held by the chuck table 4.

The upper surface of the chuck table 4 is a flat surface formed substantially in parallel to an X-axis direction (processing feed direction, first horizontal direction) and a Y-axis direction (indexing feed direction, second horizontal direction) and configures a circular holding surface 4a (see FIG. 4) that holds the wafer 11. Furthermore, to the chuck table 4, a movement mechanism (not illustrated) of a ball screw system that moves the chuck table 4 along the X-axis direction and a rotational drive source (not illustrated) such as a motor that rotates the chuck table 4 around a rotation axis substantially parallel to a Z-axis direction (vertical direction, upward-downward direction) are coupled.

The cutting unit 12 that cuts the wafer 11 is disposed over the chuck table 4. The cutting unit 12 includes a circular cylindrical housing 14 and a circular cylindrical spindle (not illustrated) disposed along the Y-axis direction is housed inside the housing 14. The tip part (one end part) of the spindle is exposed to the external of the housing 14. An annular cutting blade 16 is mounted on the tip part of the spindle. Furthermore, a rotational drive source such as a motor is coupled to the base end part (the other end part) of the spindle. The cutting blade 16 rotates around a rotation axis substantially parallel to the Y-axis direction by power transmitted from the rotational drive source through the spindle.

As the cutting blade 16, a hub-type cutting blade (hub blade) is used, for example. The hub blade is configured with integration of an annular base composed of a metal or the like and an annular cutting edge formed along the outer circumferential edge of the base. The cutting edge of the hub blade is configured by an electroformed abrasive stone in which abrasive grains composed of diamond or the like are fixed by a binder such as a nickel plating layer. Furthermore, a washer-type cutting blade (washer blade) may be used as the cutting blade 16. The washer blade is configured by an annular cutting edge in which abrasive grains are fixed by a binder composed of a metal, ceramic, resin, or the like.

The cutting blade 16 mounted on the tip part of the spindle is covered by a blade cover 18 fixed to the housing 14. The blade cover 18 includes connecting parts 20 connected to a tube (not illustrated) to which a liquid (cutting liquid) such as purified water is supplied and a pair of nozzles 22 that are connected to the connecting parts 20 and are each disposed on a respective one of both surface sides (front and back surface sides) of the cutting blade 16. A jet orifice (not illustrated) opened toward the cutting blade 16 is formed in each of the pair of nozzles 22. When the cutting liquid is supplied to the connecting parts 20, the cutting liquid is jetted from the jet orifices of the pair of nozzles 22 toward both surfaces (front and back surfaces) of the cutting blade 16. By this cutting liquid, the wafer 11 and the cutting blade 16 are cooled and dust generated due to the cutting processing (cutting dust) is washed off.

A movement mechanism (not illustrated) of a ball screw system that moves the cutting unit 12 is coupled to the cutting unit 12. This movement mechanism moves the cutting unit 12 along the Y-axis direction and raises and lowers it along the Z-axis direction.

Figure 4:
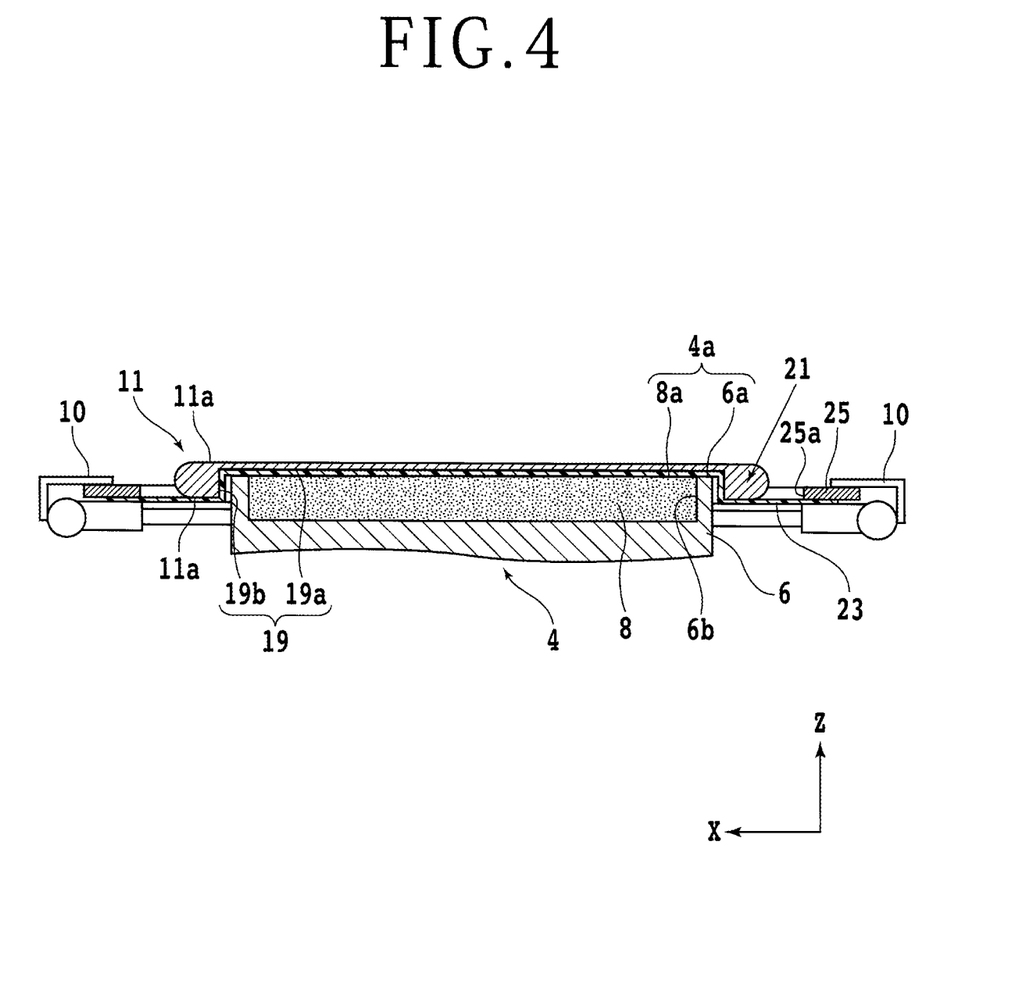
FIG. 4 is a sectional view illustrating the wafer held by a chuck table.

When the wafer 11 is processed by using the cutting apparatus 2, first, the wafer 11 is held by the chuck table 4 (holding step). FIG. 4 is a sectional view illustrating the wafer 11 held by the chuck table 4.

The chuck table 4 includes a frame body (main body part) 6 that is composed of a metal, glass, ceramic, resin, or the like and has a circular column shape. A recess part (groove) 6b with a circular shape in plan view is formed on the side of an upper surface 6a of the frame body 6 and a holding component 8 with a circular disc shape is fitted into the recess part 6b. The holding component 8 is a component composed of a porous material such as porous ceramic and internally includes pores (suction path) that communicate from the upper surface of the holding component 8 to the lower surface. The holding component 8 is connected to a suction source (not illustrated) such as an ejector through a flow path (not illustrated) formed inside the frame body 6, a valve (not illustrated), and so forth. Furthermore, the upper surface of the holding component 8 configures a circular suction surface 8a that sucks the wafer 11. The upper surface 6a of the frame body 6 and the suction surface 8a of the holding component 8 are disposed on substantially the same plane and configure the holding surface 4a of the chuck table 4.

The wafer 11 is disposed over the chuck table 4 with the side of the front surface 11a exposed upward. Incidentally, the chuck table 4 is configured to allow the holding surface 4a to hold the bottom surface 19a of the recess part 19 of the wafer 11. Specifically, the diameter of the holding surface 4a is smaller than the diameter of the recess part 19 and the side of the holding surface 4a of the chuck table 4 is fitted into the recess part 19. Thereby, the bottom surface 19a of the recess part 19 is supported by the holding surface 4a with the intervention of the adhesive tape 23.

Furthermore, plural clamps 10 that grasp and fix the frame 25 are disposed around the chuck table 4. When the wafer 11 is disposed over the chuck table 4, the frame 25 is fixed by the plural clamps 10. When a negative pressure (suction force) of the suction source is caused to act on the holding component 8 in the state in which the wafer 11 is disposed over the chuck table 4, the region stuck to the bottom surface 19a of the recess part 19 in the adhesive tape 23 is sucked by the suction surface 8a. Thereby, the bottom surface 19a of the recess part 19 is sucked and held by the chuck table 4 with the intervention of the adhesive tape 23.

Next, the wafer 11 is cut along the planned dividing lines 13 (see FIG. 3 and so forth) by the cutting blade 16 (cutting step). In the cutting step, the wafer 11 is cut along the planned dividing lines 13 parallel to a first direction and the planned dividing lines 13 parallel to a second direction that intersects the first direction.

Figure 5A:
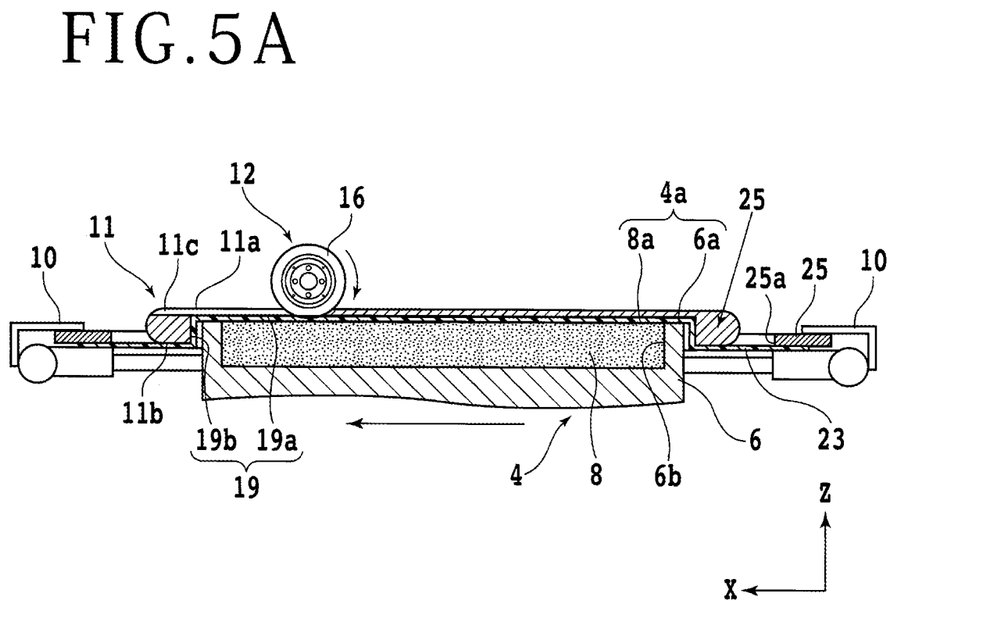
FIG. 5A is a sectional view illustrating the wafer cut along a first direction.

FIG. 5A is a sectional view illustrating the wafer 11 cut along the first direction. First, the chuck table 4 is rotated and the length direction of one planned dividing line 13 parallel to the first direction is aligned with the X-axis direction. Furthermore, the position of the cutting unit 12 in the Y-axis direction is adjusted in such a manner that the cutting blade 16 is disposed over an extended line of the one planned dividing line 13. Moreover, the height of the cutting unit 12 is adjusted in such a manner that the lower end of the cutting blade 16 is disposed on the lower side relative to the bottom surface 19a of the recess part 19. For example, the lower end of the cutting blade 16 is positioned on the lower side relative to the upper surface of the adhesive tape 23 stuck to the bottom surface 19a of the recess part 19 and on the upper side relative to the holding surface 4a (lower surface of the adhesive tape 23). The difference in the height between the front surface 11a of the wafer 11 and the lower end of the cutting blade 16 at this time is equivalent to the depth of the cutting-in of the cutting blade 16 into the wafer 11.

Then, the chuck table 4 is moved along the X-axis direction while the cutting blade 16 is rotated. Thereby, the chuck table 4 and the cutting blade 16 relatively move along the X-axis direction (processing feed) and the cutting blade 16 cuts into the side of the front surface 11a of the wafer 11 along the one planned dividing line 13. The cutting-in depth of the cutting blade 16 at this time is larger than the thickness of the central part (device region 17a, see FIG. 3 and so forth) of the wafer 11 and is smaller than the thickness of the peripheral part (reinforcing part 21) of the wafer 11. Thus, in the device region 17a of the wafer 11, a cut (kerf) that reaches the bottom surface 19a from the front surface 11a is formed along the one planned dividing line 13. Meanwhile, in the reinforcing part 21 of the wafer 11, a groove 11c with a depth corresponding to the cutting-in depth of the cutting blade 16 is formed along the one planned dividing line 13. Thereafter, the cutting blade 16 is moved in the Y-axis direction by a distance corresponding to the interval of the planned dividing lines 13 (indexing feed) and the wafer 11 is cut along another planned dividing line 13. By repeating this procedure, the wafer 11 is cut along all planned dividing lines 13 parallel to the first direction.

Figure 5B:
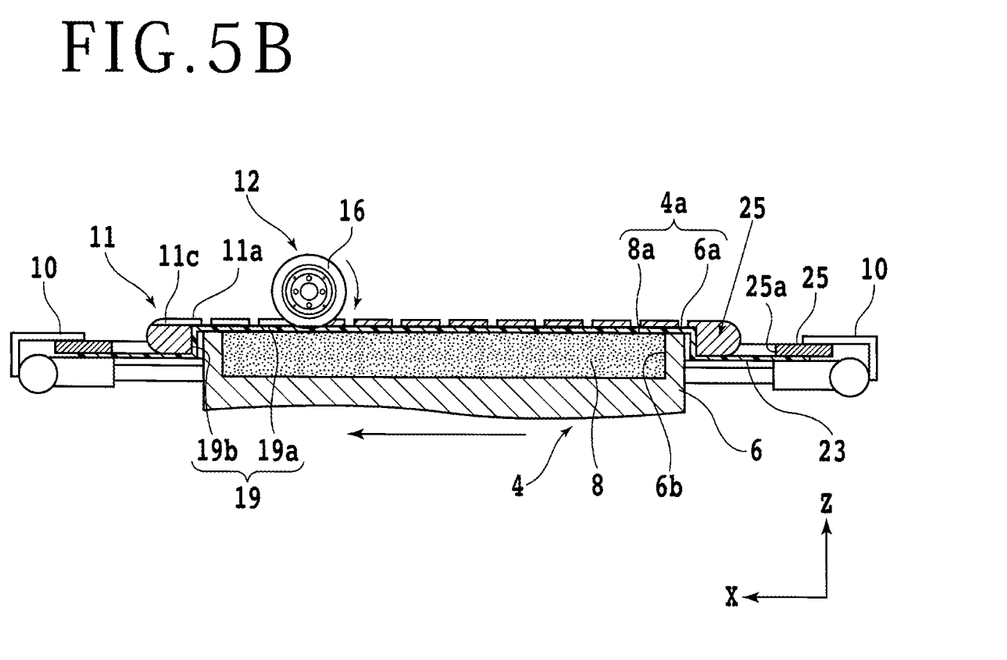
FIG. 5B is a sectional view illustrating the wafer cut along a second direction.

Next, the chuck table 4 is rotated by 90° and the length direction of the planned dividing lines 13 parallel to the second direction is aligned with the X-axis direction. Then, the wafer 11 is cut along the planned dividing lines 13 by a similar procedure. FIG. 5B is a sectional view illustrating the wafer 11 cut along the second direction. When the wafer 11 has been cut along all planned dividing lines 13, the device region 17a of the wafer 11 is divided along the planned dividing lines 13 and plural device chips 27 (see FIG. 6) each including the device 15 are obtained. Furthermore, on the side of the upper surface (front surface) of the reinforcing part 21, the grooves 11c are formed along the planned dividing lines 13.

Next, by giving an external force to the reinforcing part 21, the reinforcing part 21 is divided along the planned dividing lines 13 with the grooves 11c being the points of origin (dividing step). In the present embodiment, the external force is given to the reinforcing part 21 by sucking the adhesive tape 23 by a chuck table.

Figure 6:
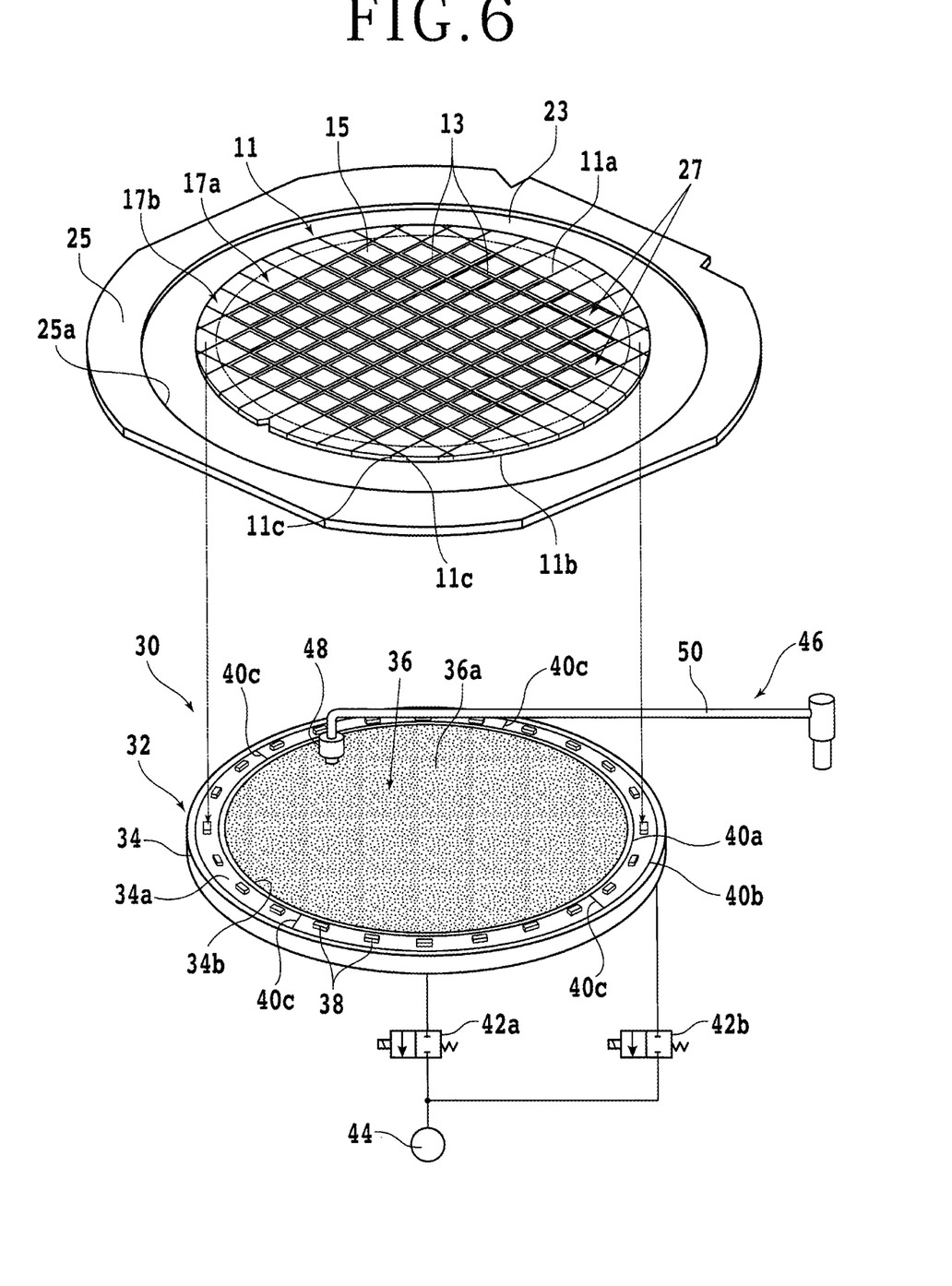
FIG. 6 is a perspective view illustrating a cleaning unit.

FIG. 6 is a perspective view illustrating a cleaning unit 30. The cleaning unit 30 is a mechanism that cleans the wafer 11 after the cutting processing and is incorporated in the cutting apparatus 2 (see FIG. 3). Furthermore, the cleaning unit 30 includes a chuck table (holding table) 32 that holds the wafer 11 and a fluid supply unit 46 that supplies fluid to the wafer 11 held by the chuck table 32.

The upper surface of the chuck table 32 configures a circular holding surface that holds the wafer 11. Furthermore, a rotational drive source (not illustrated) such as a motor that rotates the chuck table 32 around a rotation axis substantially parallel to the vertical direction is coupled to the chuck table 32. The chuck table 32 includes a frame body (main body part) 34 that is composed of a metal, glass, ceramic, resin, or the like and has a circular column shape. A recess part (groove) 34b with a circular shape in plan view is formed on the side of an upper surface 34a of the frame body 34 and a holding component 36 with a circular disc shape is fitted into the recess part 34b. The holding component 36 is a component composed of a porous material such as porous ceramic and internally includes pores (suction path) that communicate from the upper surface of the holding component 36 to the lower surface. The upper surface of the holding component 36 configures a circular suction surface 36a that sucks and holds the wafer 11. Furthermore, the upper surface 34a of the frame body 34 and the suction surface 36a of the holding component 36 are disposed on substantially the same plane.

Recesses and projections are made at a position corresponding to the reinforcing part 21 of the wafer 11 in the chuck table 32. For example, the frame body 34 is formed in such a manner that the upper surface 34a overlaps with the reinforcing part 21 when the wafer 11 is disposed over the chuck table 32. Furthermore, plural projection parts (protrusions) 38 that protrude upward from the upper surface 34a are disposed on the side of the upper surface 34a of the frame body 34. Incidentally, although the projection parts 38 formed into a rectangular parallelepiped shape are illustrated in FIG. 6, there is no limit on the shape of the projection parts 38. The plural projection parts 38 are arranged at substantially equal intervals along the circumferential direction of the frame body 34. Furthermore, an annular region having periodic recesses and projections is configured by the upper surface 34a of the frame body 34 and the projection parts 38. Moreover, annular grooves 40a and 40b that are opened in the upper surface 34a are made on the side of the upper surface 34a of the frame body 34. For example, the grooves 40a and 40b are concentrically formed on both sides (outside and inside in the radial direction of the frame body 34) of the plural projection parts 38. Furthermore, the groove 40a and the groove 40b are coupled to each other through plural grooves 40c formed along the radial direction of the frame body 34. The holding component 36 is connected to a suction source 44 through a flow path (not illustrated) made inside the frame body 34 and a valve 42a. Furthermore, the grooves 40a, 40b, and 40c are connected to the suction source 44 through the flow path (not illustrated) made inside the frame body 34 and a valve 42b. The suction source 44 is configured by an ejector or the like.

Figure 7A:
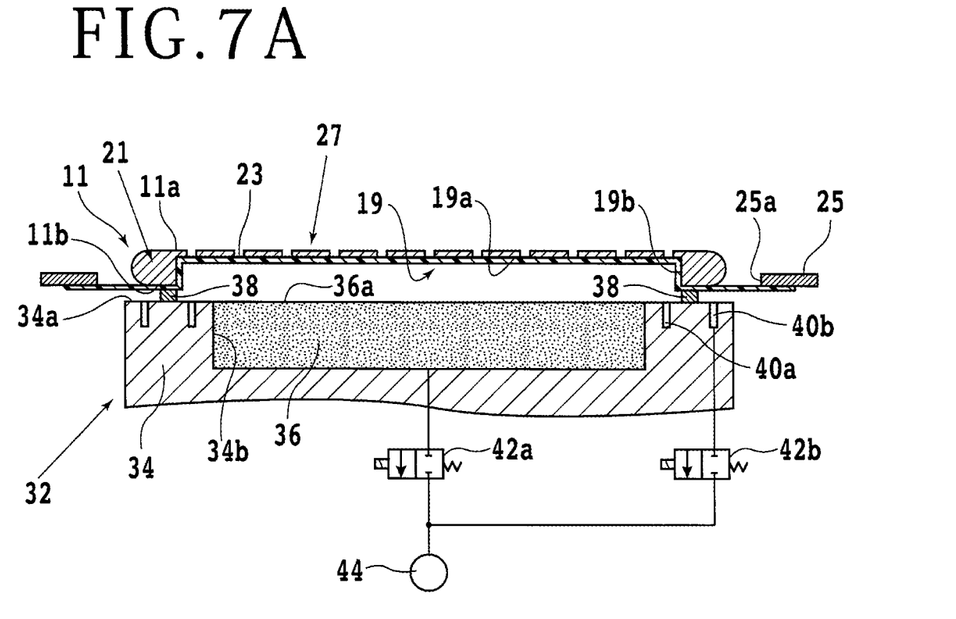
FIG. 7A is a sectional view illustrating the wafer disposed over a chuck table.

The wafer 11 is disposed over the chuck table 32 in such a manner that the reinforcing part 21 overlaps with the upper surface 34a of the frame body 34. Due to this, the reinforcing part 21 of the wafer 11 is supported by the plural projection parts 38 with the intervention of the adhesive tape 23. FIG. 7A is a sectional view illustrating the wafer 11 disposed over the chuck table 32. Incidentally, in FIG. 7A, for convenience of explanation, only the shapes of the wafer 11, the adhesive tape 23, the frame 25, and the chuck table 32 in the section are illustrated.

Figure 7B:
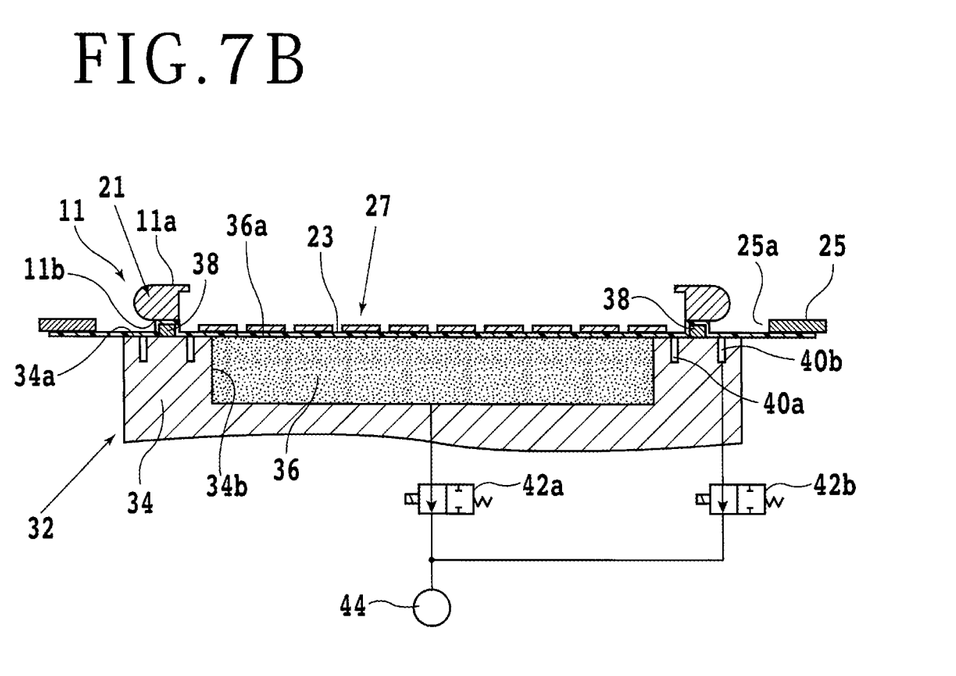
FIG. 7B is a sectional view illustrating the wafer sucked by the chuck table.

When the valves 42a and 42b are opened in the state in which the wafer 11 is disposed over the chuck table 32, a negative pressure of the suction source 44 acts on the holding component 36 and the grooves 40a and 40b, and the wafer 11 is sucked and held by the chuck table 32 with the intervention of the adhesive tape 23. FIG. 7B is a sectional view illustrating the wafer 11 sucked by the chuck table 32. The region stuck to the inside of the recess part 19 of the wafer 11 in the adhesive tape 23 is sucked by the holding component 36 and is peeled off from the recess part 19 to get contact with the suction surface 36a. Furthermore, the region stuck to the reinforcing part 21 in the adhesive tape 23 is sucked by the grooves 40a and 40b and is peeled off from the reinforcing part 21 to get contact with the upper surface 34a of the frame body 34.

Here, as illustrated in FIG. 6, the periodic recesses and projections are annularly formed by the plural projection parts 38 on the side of the upper surface 34a of the frame body 34. Thus, when the negative pressure is caused to act on the grooves 40a and 40b, the region stuck to the reinforcing part 21 in the adhesive tape 23 gets deformed along the upper surface 34a of the frame body 34 and the projection parts 38 and becomes an undulate state. Furthermore, the region that is not supported by the projection parts 38 in the reinforcing part 21 is pulled toward the side of the upper surface 34a of the frame body 34 by the adhesive tape 23 and moves to enter the space between the adjacent projection parts 38. As a result, a shear stress acts on the reinforcing part 21. That is, an external force is given to the reinforcing part 21 by sucking the adhesive tape 23 by the chuck table 32. When the external force is given to the reinforcing part 21, cracks are generated from the grooves 11c formed in the reinforcing part 21 and progress in the thickness direction of the reinforcing part 21. Due to this, the reinforcing part 21 breaks along the planned dividing lines 13. That is, the grooves 11c function as the points of origin of dividing of the reinforcing part 21 and the annular reinforcing part 21 is divided into plural chips along the planned dividing lines 13.

Incidentally, in the dividing step, the reinforcing part 21 does not necessarily need to be divided along all grooves 11c. That is, it suffices that the reinforcing part 21 is divided into plural chips with a predetermined size or smaller in order for the reinforcing part 21 to be properly removed in a reinforcing part removal step to be described later. Furthermore, although the example in which the recesses and projections of the chuck table 32 are configured by the upper surface 34a of the frame body 34 and the projection parts 38 has been described in FIG. 6, there is no limit on the forming method of recesses and projections. For example, recesses and projections may be formed by making plural recess parts (grooves) on the side of the upper surface 34a of the frame body 34. Moreover, the method for giving an external force to the reinforcing part 21 is not limited to suction of the adhesive tape 23 by the chuck table 32. For example, an external force may be given to the reinforcing part 21 by pushing a pressing component against the reinforcing part 21 in the state in which the wafer 11 is held by a predetermined chuck table. Furthermore, an external force may be given to the reinforcing part 21 by using an expanding tape (tape that can be expanded by giving an external force) as the adhesive tape 23 and pulling the expanding tape to expand it.

Next, the reinforcing part 21 divided into the plural chips is removed (reinforcing part removal step). In the reinforcing part removal step, the respective chips formed through the dividing of the reinforcing part 21 are peeled off from the adhesive tape 23 and are removed. This makes the state in which only the plural device chips 27 are stuck to the adhesive tape 23. For the removal of the reinforcing part 21, the fluid supply unit 46 (see FIG. 6) is used, for example. The fluid supply unit 46 includes a nozzle 48 that jets fluid and an arm 50 that swings the nozzle 48.

Figure 8A:
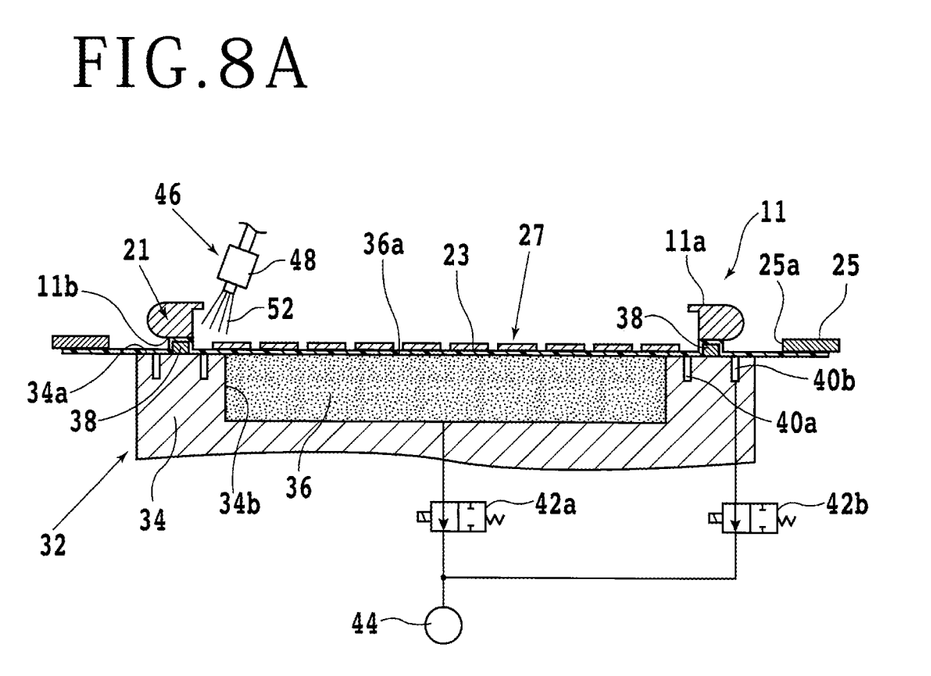
FIG. 8A is a sectional view illustrating the wafer for which fluid is jetted to a reinforcing part.

FIG. 8A is a sectional view illustrating the wafer 11 for which fluid 52 is jetted to the reinforcing part 21. In the reinforcing part removal step, first, the nozzle 48 is swung to be disposed at a position that overlaps with a region inside the reinforcing part 21. Then, the fluid 52 is jetted from the nozzle 48 toward the reinforcing part 21. Thereby, the chips of the reinforcing part 21 are blown off by the fluid 52 to be peeled off from the adhesive tape 23 and be removed.

Figure 8B:
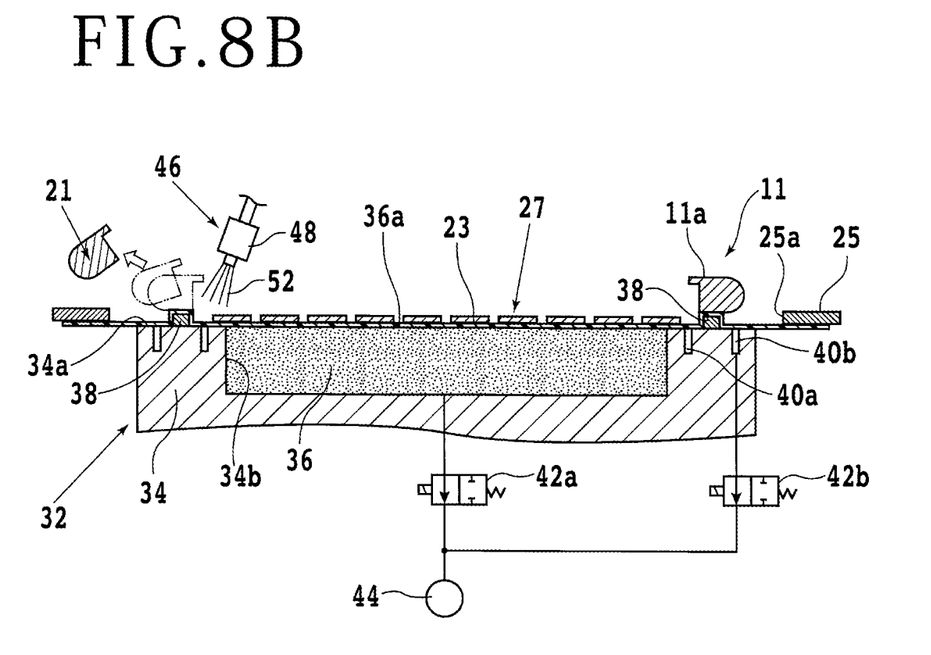
FIG. 8B is a sectional view illustrating the wafer from which the reinforcing part is removed.

FIG. 8B is a sectional view illustrating the wafer 11 from which the reinforcing part 21 is removed. In the case of removing the reinforcing part 21 by the jetting of the fluid 52, it is preferable to jet the fluid 52 from the center side of the wafer 11 (inside of the reinforcing part 21) toward the peripheral side of the wafer 11 (outside of the reinforcing part 21). In this case, the chips of the reinforcing part 21 are scattered outward in the radial direction of the reinforcing part 21. This can prevent the chips of the reinforcing part 21 from being scattered to the side of the device chips 27 to scratch the device chips 27. For example, the jet direction of the fluid 52 is adjusted by inclining the nozzle 48 with respect to the vertical direction (see FIG. 8A and FIG. 8B). Then, the chuck table 32 is rotated while the fluid 52 is jetted from the nozzle 48. Thereby, the fluid 52 is jetted to the whole of the reinforcing part 21 and the chips of the reinforcing part 21 are sequentially peeled-off and removed from the adhesive tape 23.

Here, if the reinforcing part 21 is not divided and remains in the continuous annular state, work of carefully holding the reinforcing part 21 and raising the reinforcing part 21 in such a manner as to avoid the occurrence of a swing or position deviation of the reinforcing part 21 is required to properly remove the reinforcing part 21. Thus, a precise conveying mechanism and so forth for executing the removal of the reinforcing part 21 are required and the work time necessary for the removal of the reinforcing part 21 also becomes long. On the other hand, in the present embodiment, the annular reinforcing part 21 is divided into plural chips in the dividing step. Therefore, the reinforcing part 21 can be removed extremely easily through only giving a moderate external force to the respective chips in the reinforcing part removal step.

Incidentally, there is no limit on the fluid 52 jetted to the reinforcing part 21. For example, a liquid such as pressurized purified water (high-pressure liquid) is jetted as the fluid 52. Furthermore, it is also possible to use mixed fluid containing a liquid (purified water or the like) and a gas (air or the like) as the fluid 52. Moreover, the plural device chips 27 may be coated with a protective film when the fluid is jetted to the reinforcing part 21. For example, purified water may be supplied from the upper side of the chuck table 32 toward the wafer 11 and the plural device chips 27 may be coated with a water film. This causes the device chips 27 to become less likely to be damaged even if by any chance a chip of the reinforcing part 21 is scattered to the side of the device chips 27. In this case, a nozzle that supplies the liquid (purified water or the like) for forming the protective film to the wafer 11 held by the chuck table 32 may be mounted on the cleaning unit 30. Furthermore, although the case in which the dividing step and the reinforcing part removal step are executed by using the chuck table 32 disposed in the cleaning unit 30 has been explained in the above description, it is also possible to use another chuck table prepared separately from the cleaning unit 30. Furthermore, separate chuck tables may be used for the dividing step and the reinforcing part removal step.

As described above, in the processing method of a wafer according to the present embodiment, in the cutting step, the device region 17a is divided into the plural device chips 27. In addition, the grooves 11c are formed on the front surface side of the reinforcing part 21. Then, in the dividing step, an external force is given to the reinforcing part 21 and the reinforcing part 21 is divided with the grooves 11c being the points of origin. As a result, it becomes possible to easily remove the reinforcing part 21 from the wafer 11 by a simple method such as jetting the fluid 52 to the divided reinforcing part 21, for example.

Incidentally, in the above-described processing method of a wafer, after execution of the holding step (see FIG. 4) and before execution of the dividing step (see FIG. 7A and FIG. 7B), the device region 17a and the reinforcing part 21 may be separated (separation step). For example, the separation step is executed by using the cutting apparatus 2 illustrated in FIG. 3 before or after execution of the cutting step (see FIG. 5A and FIG. 5B).

Specifically, first, in the state in which the wafer 11 is held by the chuck table 4 (see FIG. 4), the positions of the chuck table 4 and the cutting unit 12 are adjusted in such a manner that the cutting blade 16 is disposed directly above the peripheral part of the device region 17a (thinned region) of the wafer 11. Then, the cutting unit 12 is lowered while the cutting blade 16 is rotated, and the cutting blade 16 is caused to cut into part of the peripheral part of the device region 17a. The amount of lowering of the cutting unit 12 at this time is set in such a manner that the lower end of the cutting blade 16 reaches the adhesive tape 23 stuck to the bottom surface 19a of the recess part 19. Next, in the state in which the cutting blade 16 cuts into the wafer 11, the chuck table 4 is caused to make one rotation with the cutting blade 16 kept on rotating. Thereby, the wafer 11 is annularly cut and split along the outer peripheral part of the device region 17a and is split. As a result, the reinforcing part 21 is cut off from the wafer 11 and the device region 17a and the reinforcing part 21 are separated.

When the above-described separation step is executed, at the time of execution of the subsequent dividing step, the protruding part (see FIG. 7A and FIG. 7B) that protrudes from the upper part of the reinforcing part 21 to the side of the device chips 27 does not remain or the protruding part becomes short. This can prevent the occurrence of the situation in which the protruding part pulled by the adhesive tape 23 breaks and is scattered to the side of the device chips 27 when the adhesive tape 23 is sucked in the dividing step.

Figure 9A:
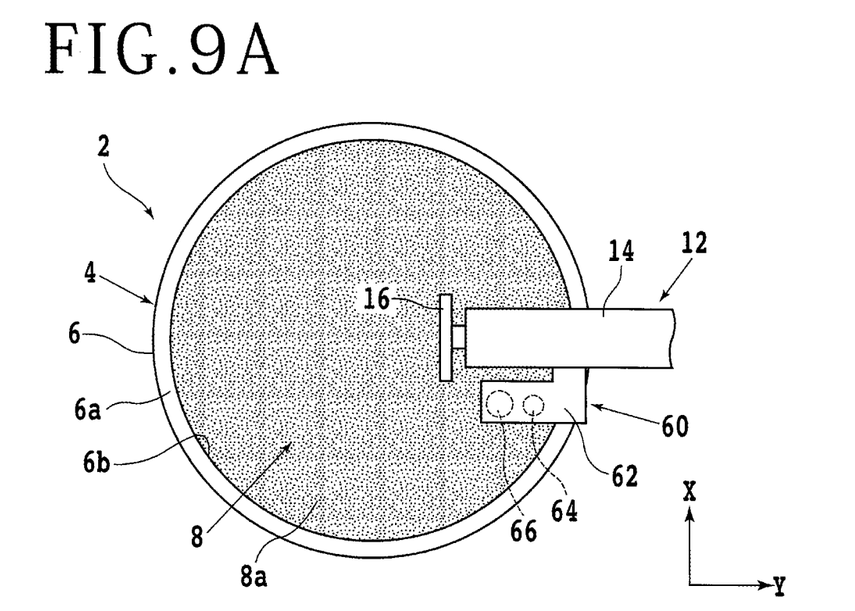
FIG. 9A is a plan view illustrating the cutting apparatus including a groove forming unit.
Figure 9B:
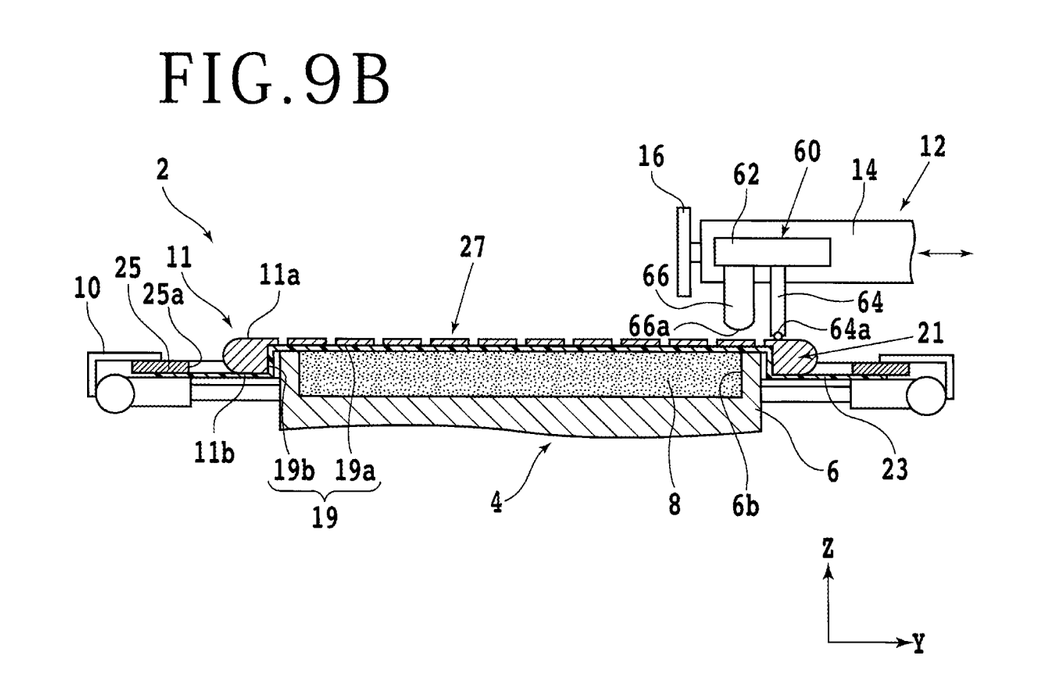
FIG. 9B is a sectional view illustrating the cutting apparatus including the groove forming unit.

Furthermore, in the above-described processing method of a wafer, after execution of the cutting step (see FIG. 5A and FIG. 5B) and before execution of the dividing step (see FIG. 7A and FIG. 7B), plural scribed lines (grooves) may be formed in the reinforcing part 21 (scribed line forming step). The scribed line forming step is executed by using the cutting apparatus 2 on which a groove forming unit (scribed line forming unit) 60 is mounted, for example. FIG. 9A is a plan view illustrating the cutting apparatus 2 including the groove forming unit 60. FIG. 9B is a sectional view illustrating the cutting apparatus 2 including the groove forming unit 60. Incidentally, in FIG. 9B, the wafer 11 after execution of the cutting step is also illustrated. For example, the groove forming unit 60 is mounted on a side surface of the housing 14 of the cutting unit 12. Specifically, the groove forming unit 60 includes a fixed component 62 fixed to the side surface of the housing 14. The fixed component 62 is formed into an L-shape in plan view and is disposed adjacent to the housing 14 in the X-axis direction. To the lower surface side of the fixed component 62, a cutter 64 that forms scribed lines (grooves) in the wafer 11 and a pressing component 66 that presses the wafer 11 are fixed. The cutter 64 and the pressing component 66 are disposed adjacent to each other in the Y-axis direction. The cutter 64 includes a cutting edge 64a at the lower end part. As the cutting edge 64a, a diamond cutter is used, for example. Furthermore, the pressing component 66 is a circular cylindrical component composed of a metal, resin, or the like. The lower surface of the pressing component 66 is formed into a curved surface shape and configures a pressing surface 66a that presses the wafer 11.

In the scribed line forming step, first, the groove forming unit 60 is moved and the cutting edge 64a of the cutter 64 is brought into contact with the front surface side of the reinforcing part 21. Incidentally, the movement of the groove forming unit 60 is controlled by a movement mechanism (not illustrated) coupled to the cutting unit 12. Then, the groove forming unit 60 is moved along the Y-axis direction in the state in which the cutting edge 64a is in contact with the reinforcing part 21. Thereby, a linear scribed line is formed along the radial direction of the reinforcing part 21 on the front surface side of the reinforcing part 21. Next, the chuck table 4 is rotated by a predetermined angle and a scribed line is similarly formed in the reinforcing part 21. By repeating this procedure, plural scribed lines are formed along the radial direction of the reinforcing part 21.

The scribed lines function as the points of origin of dividing of the wafer 11 together with the grooves 11c (see FIG. 6) formed in the reinforcing part 21. That is, when the scribed lines are formed, cracks become more likely to be generated in the reinforcing part 21 in the dividing step (see FIG. 7A and FIG. 7B) and dividing of the reinforcing part 21 is assisted. This makes it possible to surely divide the reinforcing part 21 into plural chips.

Furthermore, after the scribed lines are formed in the reinforcing part 21, the reinforcing part 21 may be divided by pushing the pressing component 66 against the reinforcing part 21. Specifically, after the scribed lines are formed in the reinforcing part 21 by the cutter 64, the pressing component 66 is moved along the Y-axis direction to be positioned directly above the reinforcing part 21, and is lowered toward the reinforcing part 21. Thereby, the pressing surface 66a gets contact with the reinforcing part 21 and pushes the reinforcing part 21 downward. As a result, an external force is given to the reinforcing part 21 and the reinforcing part 21 is divided with the scribed lines and the grooves 11c (see FIG. 6) being the points of origin. Then, the chuck table 4 is rotated by a predetermined angle in each rotation and the formation of a scribed line and pressing of the reinforcing part 21 by the pressing component 66 are repeated. That is, the scribed line forming step and the dividing step are alternately executed plural times. Thereby, the reinforcing part 21 sequentially breaks along the circumferential direction and the reinforcing part 21 is divided into plural chips finally.

Besides, structures, methods, and so forth according to the above-described embodiment can be carried out with appropriate changes without departing from the scope of the object of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing method of a wafer for processing the wafer that includes, on a front surface side, a device region in which a device is formed in each of a plurality of regions marked out by a plurality of planned dividing lines arranged in a lattice manner to intersect each other and includes a recess part with a bottom surface and a side surface formed in a region corresponding to the device region on a back surface side and includes an annular reinforcing part that surrounds the device region and the recess part at a peripheral part, the processing method of a wafer comprising:
 a tape sticking step of sticking an adhesive tape to the back surface side of the wafer along the bottom surface and the side surface of the recess part and the annular reinforcing part;
 a holding step, after the tape sticking step, of holding a bottom surface of the recess part by a first chuck table with intervention of the adhesive tape;
 a cutting step, after the holding step, of cutting the wafer along the planned dividing lines by a cutting blade to divide the device region into a plurality of device chips and form grooves on the front surface side of the annular reinforcing part; and
 a dividing step, after the cutting step, of dividing the annular reinforcing part into plural chips along the planned dividing lines with the grooves being points of origin by giving an external force to the annular reinforcing part.

2. The processing method of a wafer according to claim 1, wherein,
 in the dividing step, by sucking the adhesive tape by a second chuck table having recesses and projections at a position corresponding to the reinforcing part of the wafer in a state in which the wafer is supported by the second chuck table, the adhesive tape is disposed along the recesses and projections to divide the reinforcing part.

3. The processing method of a wafer according to claim 1, further comprising:
 a separation step of separating the device region and the reinforcing part by annularly cutting a peripheral part of the device region by the cutting blade after execution of the holding step and before execution of the dividing step.

4. The processing method of a wafer according to claim 1, further comprising:
 a reinforcing part removal step of removing the reinforcing part by jetting fluid to the reinforcing part after execution of the dividing step.

5. The processing method of a wafer according to claim 4, wherein:
 the fluid is jetted from a center side of the wafer toward a peripheral side of the wafer.

6. The processing method of a wafer according to claim 4, wherein:
 the fluid is mixed fluid containing a gas and a liquid.

7. The processing method of a wafer according to claim 4, wherein:
 the fluid is a liquid.

8. The processing method of a wafer according to claim 1, further comprising:
 a scribed line forming step of forming a plurality of scribed lines in the reinforcing part along a radial direction of the reinforcing part after execution of the cutting step and before execution of the dividing step.

9. The processing method of a wafer according to claim 1, wherein the recess part is circular in shape.

10. A processing method of a wafer for processing the wafer that includes, on a front surface side, a device region in which a device is formed in each of a plurality of regions marked out by a plurality of planned dividing lines arranged in a lattice manner to intersect each other and includes a recess part formed in a region corresponding to the device region on a back surface side and includes an annular reinforcing part that surrounds the device region and the recess part at a peripheral part, the processing method of a wafer comprising:
 a tape sticking step of sticking an adhesive tape to the back surface side of the wafer along the recess part and the reinforcing part;
 a holding step of holding a bottom surface of the recess part by a first chuck table with intervention of the adhesive tape;
 a cutting step of cutting the wafer along the planned dividing lines by a cutting blade to divide the device region into a plurality of device chips and form grooves on the front surface side of the reinforcing part;
 a dividing step of dividing the reinforcing part along the planned dividing lines with the grooves being points of origin by giving an external force to the reinforcing part; and
 a reinforcing part removal step of removing the reinforcing part by jetting fluid to the reinforcing part after execution of the dividing step.

11. The processing method of a wafer according to claim 10, wherein the fluid is jetted from a center side of the wafer toward a peripheral side of the wafer.

12. The processing method of a wafer according to claim 10, wherein the recess part is circular in shape.

13. The processing method of a wafer according to claim 10, further comprising:
 a scribed line forming step of forming a plurality of scribed lines in the reinforcing part along a radial direction of the reinforcing part after execution of the cutting step and before execution of the dividing step.

14. The processing method of a wafer according to claim 10, wherein, in the dividing step, by sucking the adhesive tape by a second chuck table having recesses and projections at a position corresponding to the reinforcing part of the wafer in a state in which the wafer is supported by the second chuck table, the adhesive tape is disposed along the recesses and projections to divide the reinforcing part.

15. The processing method of a wafer according to claim 10, further comprising:
a separation step of separating the device region and the reinforcing part by annularly cutting a peripheral part of the device region by the cutting blade after execution of the holding step and before execution of the dividing step.

16. A processing method of a wafer for processing the wafer that includes, on a front surface side, a device region in which a device is formed in each of a plurality of regions marked out by a plurality of planned dividing lines arranged in a lattice manner to intersect each other and includes a recess part formed in a region corresponding to the device region on a back surface side and includes an annular reinforcing part that surrounds the device region and the recess part at a peripheral part, the processing method of a wafer comprising:
a tape sticking step of sticking an adhesive tape to the back surface side of the wafer along the recess part and the reinforcing part;
a holding step of holding a bottom surface of the recess part by a first chuck table with intervention of the adhesive tape;
a cutting step of cutting the wafer along the planned dividing lines by a cutting blade to divide the device region into a plurality of device chips and form grooves on the front surface side of the reinforcing part; and
a dividing step of dividing the reinforcing part along the planned dividing lines with the grooves being points of origin by giving an external force to the reinforcing part, wherein in the dividing step, by sucking the adhesive tape by a second chuck table having recesses and projections at a position corresponding to the reinforcing part of the wafer in a state in which the wafer is supported by the second chuck table, the adhesive tape is disposed along the recesses and projections to divide the reinforcing part.

17. The processing method of a wafer according to claim 16, further comprising:
a separation step of separating the device region and the reinforcing part by annularly cutting a peripheral part of the device region by the cutting blade after execution of the holding step and before execution of the dividing step.

18. The processing method of a wafer according to claim 16, further comprising:
a reinforcing part removal step of removing the reinforcing part by jetting fluid to the reinforcing part after execution of the dividing step.

19. The processing method of a wafer according to claim 18, wherein the fluid is jetted from a center side of the wafer toward a peripheral side of the wafer.

20. The processing method of a wafer according to claim 16, wherein the recess part is circular in shape.

* * * * *